United States Patent [19]

Nara et al.

[11] 4,214,228
[45] Jul. 22, 1980

[54] ERROR-CORRECTING AND ERROR-DETECTING SYSTEM

[75] Inventors: Yasuhiro Nara, Chigasaki; Yukio Sohma; Akira Hattori, both of Yokohama, all of Japan

[73] Assignee: Fujitsu Limited, Kawasaki, Japan

[21] Appl. No.: 939,488

[22] Filed: Sep. 5, 1978

[30] Foreign Application Priority Data

Dec. 23, 1977 [JP] Japan .................................. 52-155952

[51] Int. Cl.² ............................................... G06F 11/12
[52] U.S. Cl. ..................................................... 371/40
[58] Field of Search ................ 340/146.1 AL; 235/312

[56] References Cited

U.S. PATENT DOCUMENTS

| 3,825,893 | 7/1974 | Bossen et al. | 340/146.1 AL |
| 3,893,070 | 7/1975 | Bossen et al. | 340/146.1 AL |
| 3,893,071 | 7/1975 | Bossen et al. | 340/146.1 AL |
| 3,949,208 | 4/1976 | Carter | 235/312 |
| 4,077,028 | 2/1978 | Lui et al. | 340/146.1 AL |
| 4,099,160 | 7/1978 | Flagg | 340/146.1 AL |

OTHER PUBLICATIONS

Hong and Patel, A General Class of Maximal Codes for Computer Applications, IEEE Trans. on Computers, vol. C-21, No. 12, Dec. 1972, pp. 1322-1331.

Primary Examiner—Charles E. Atkinson
Attorney, Agent, or Firm—Staas & Halsey

[57] ABSTRACT

Described is an error-correcting and error-detecting system including a check-bits generating circuit which is formed in accordance with a (k,l) type check matrix, such (k,l) type check matrix being formed from an (m,l) type reference sub-matrix (where m<k) and one or more (m,l) type sub-matrices, and each of the (m,l) type sub-matrices being derived from the (m,l) type reference sub-matrix by replacing unit-matrices of the (m,l) type reference sub-matrix with each other in accordance with a circular shift; wherein a desired check-bits code of an input data is obtained by multiplying the input data with respective reference sub-matrix and sub-matrices and by rearranging respective multiplied results produced from the respective rows of these reference sub-matrix and sub-matrices.

10 Claims, 21 Drawing Figures

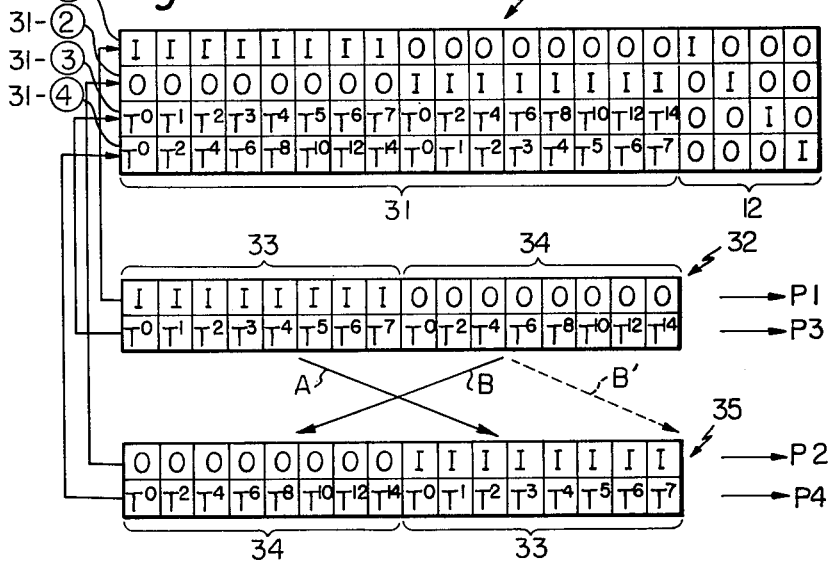

| | | | | | | | | | | | | | | | | | |
|---|---|---|---|---|---|---|---|---|---|---|---|---|---|---|---|---|---|
| r0 | 0 | 0 | 0 | 0 | 1 | 1 | 1 | 1 | 1 | 1 | 1 | 0 | 0 | 0 | 1 | 0 |
| r1 | 0 | 0 | 1 | 1 | 0 | 0 | 1 | 1 | 1 | 1 | 0 | 1 | 0 | 0 | 0 | 1 |
| r2 | 0 | 1 | 0 | 1 | 0 | 1 | 0 | 0 | 1 | 1 | 0 | 0 | 1 | 0 | 1 | 1 |
| r3 | 0 | 1 | 1 | 0 | 1 | 0 | 0 | 1 | 0 | 1 | 0 | 0 | 0 | 1 | 1 | 1 |
| ERROR STATUS | NE | DE | | | | | | | | | SE (CB) | | | | X1 | X2 |

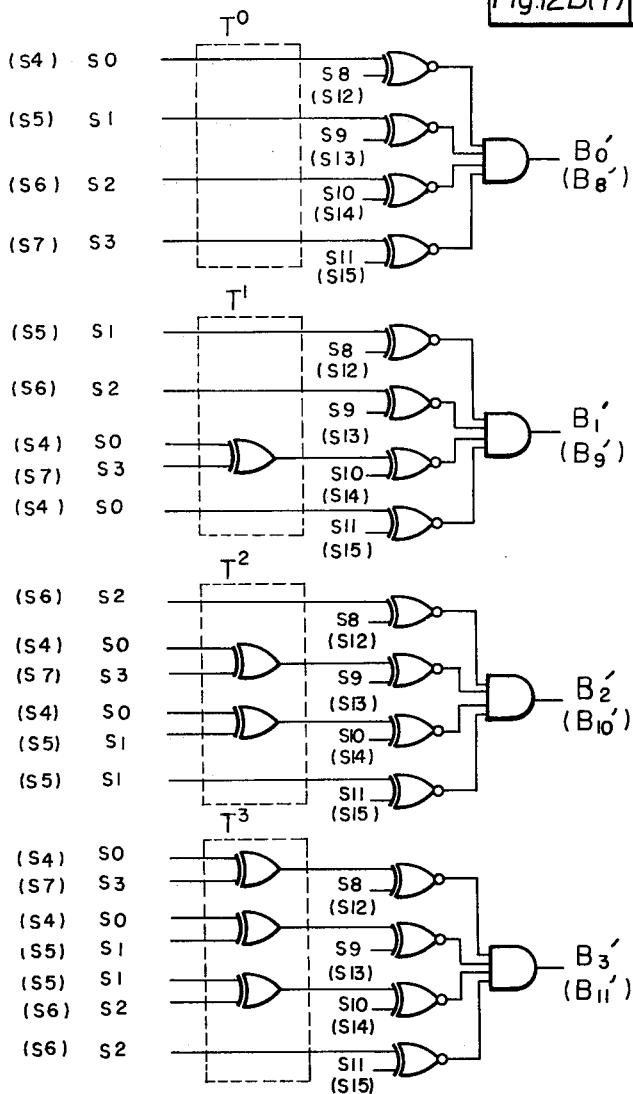
Fig. 12B(1)

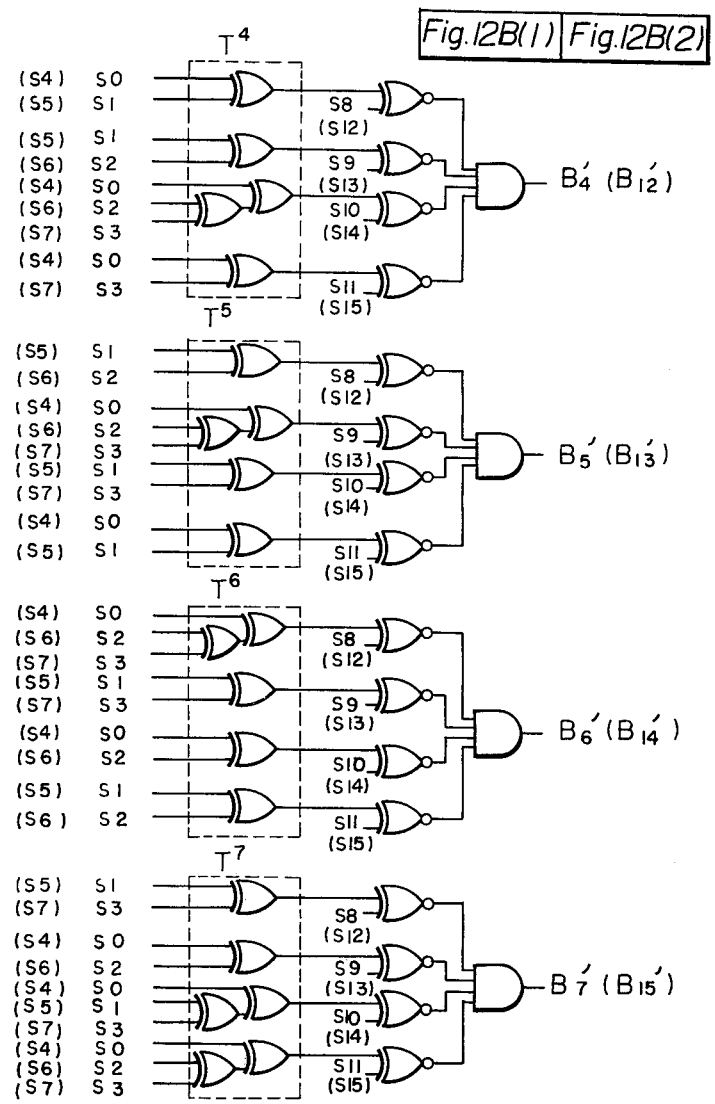
Fig. 12B(2)

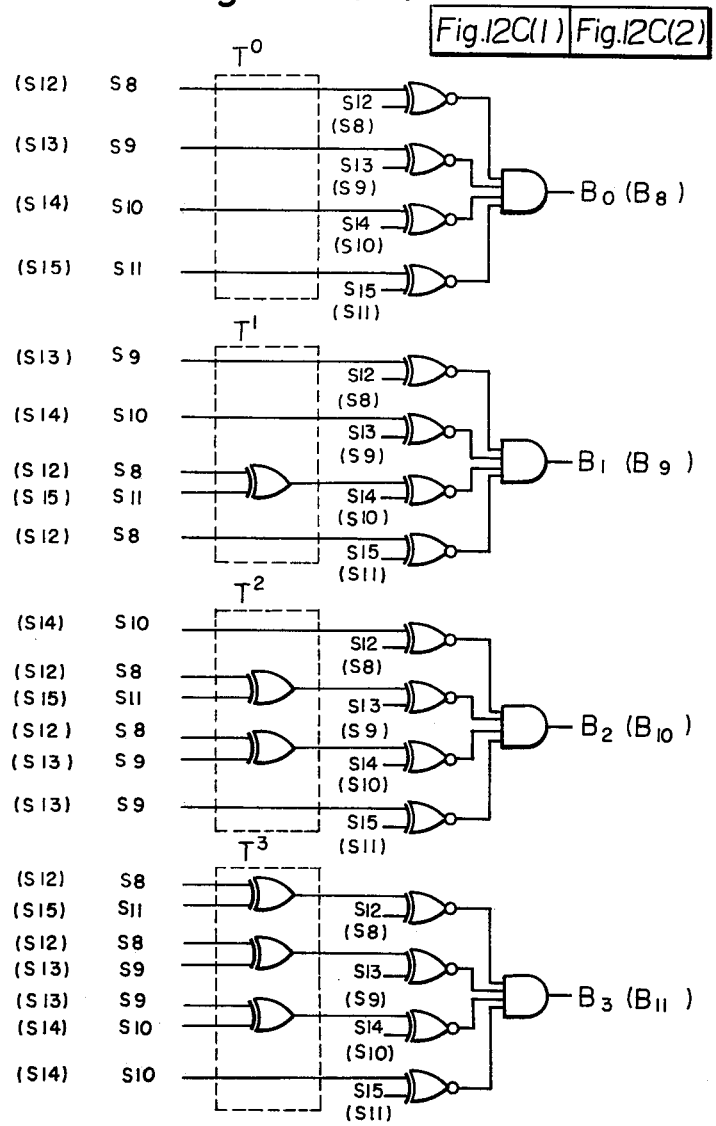
Fig. I2C(1)

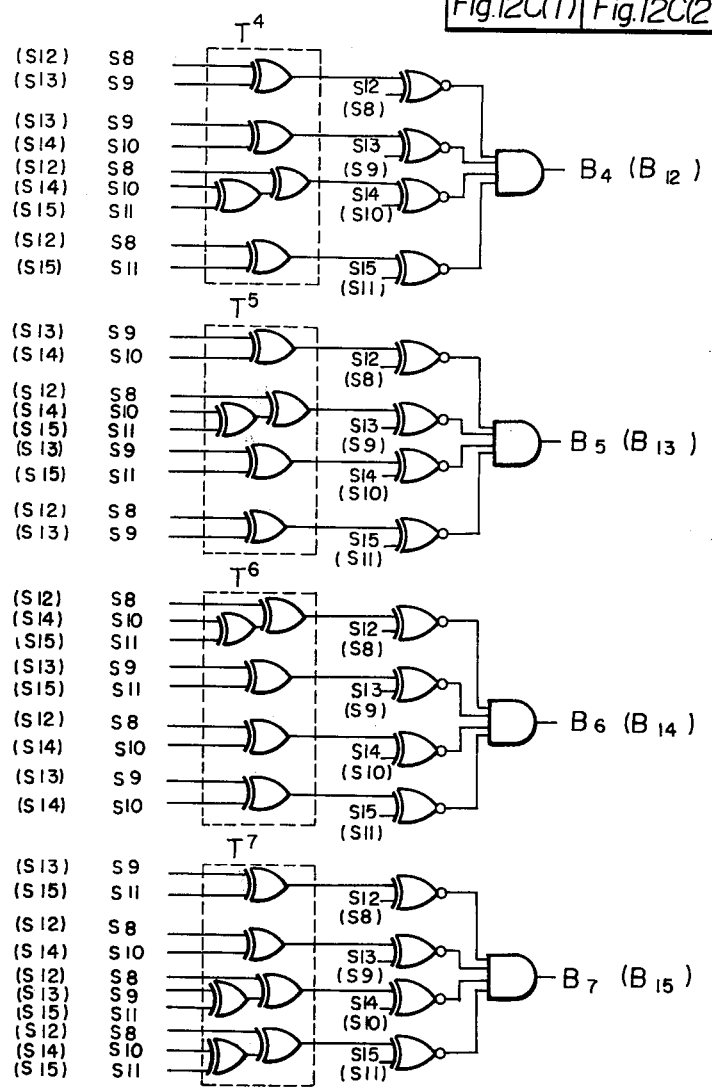
Fig. 12C(2)

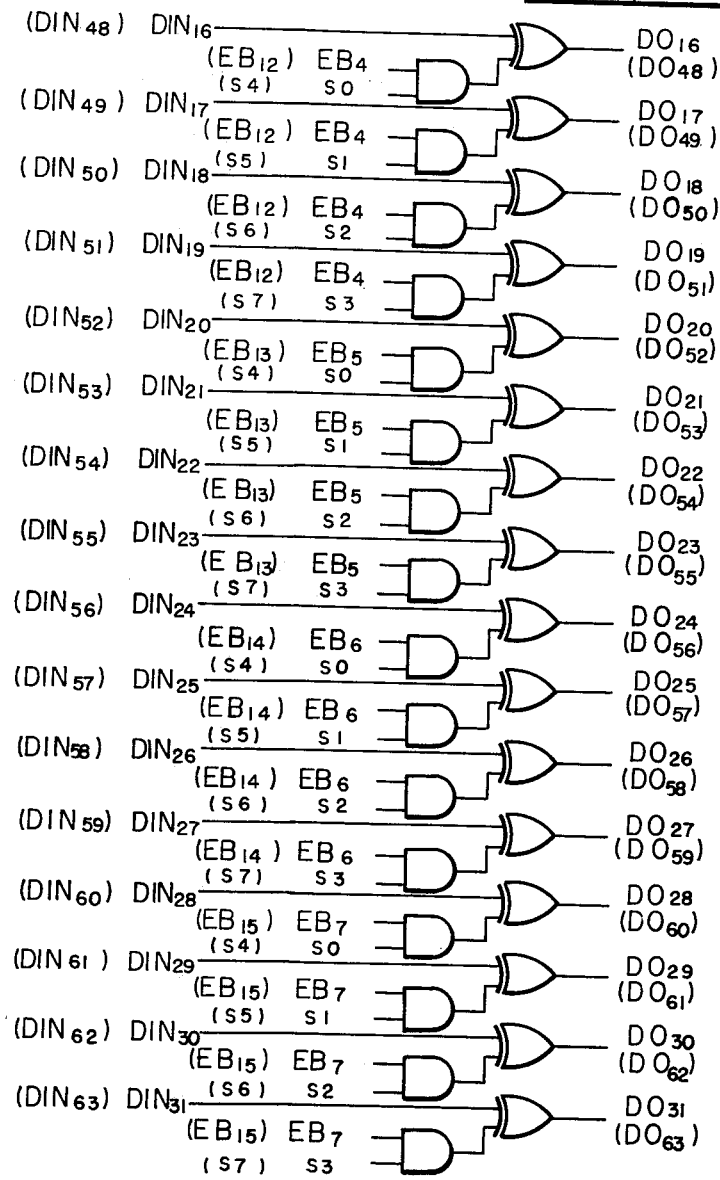

ERROR-CORRECTING AND ERROR-DETECTING SYSTEM

BACKGROUND OF THE INVENTION (1) Field of the Invention

The present invention relates to an error-correcting and error-detecting system which carries out both a b-bit single burst block error-correcting operation and a double burst block error-detecting operation by utilizing a (k,l) type check matrix, i.e., the so-called H-matrix.

(2) Description of the Prior Art

Generally, in a large capacity memory system, error-correcting and error-detecting codes are widely used to improve the reliability of reading and writing operations therein. However, one bit error-correcting codes and two bit error-detecting codes have only been employed to improve the above-mentioned reliability, and accordingly, it is impossible to carry out an error-correcting operation when more errors occur in the memory system. Such a memory system usually stores a plurality of data bits as one block of information and a set of a plurality of such blocks of information composes one word. In the above memory system, when any error occurs therein, the error causes, as a whole, an error in one block of information. As a result, it is impossible to carry out such an error-correcting operation in a large capacity memory system.

In order to carry out the above-mentioned error-correcting operation, a high-speed error-correcting method was proposed in the article, entitled "b-Adjacent Error Correction" by D. C. Bossen in *IBM J. Res. Develop.*, vol. 14, No. 4, pages 402 to 409, 1970, which discloses the correction of all single-bit errors as well as the correction of all single clusters of b-adjacent-bit errors. Furthermore, an expanded b-adjacent-bit correction has also been proposed by Se June Hong and Arvind M. Patel in the article entitled "A General Class of Maximal Codes for Computer Applications" in *IEEE transactions on Computers*, vol. C-21, No. 12, pages 1322 to 1331, December, 1972.

Based on the above two technical reports, various check-bits generating circuits were proposed. One of such check-bits generating circuits was proposed by us for solving the problem contained in the systems disclosed in the two technical reports. The problem disclosed in these reports is that the number of information bits is limited to $(2^b-1) \times b$ bits, i.e., $(2^b-1)$ blocks. Accordingly, it is disadvantageous that such number is limited to $(2^b-1) \times b$, because the number of information bits is generally selected to be $2^n$ (where n is a positive integer). For the purpose of eliminating the disadvantage, in our above-mentioned check-bits generating circuit, b bits of check-bits are further employed, and therefore the b-adjacent single burst error correcting operation and the b-adjacent double burst error detecting operation can be carried out with respect to information having the number of bits of up to $2^b \times b$, i.e., $2^b$ blocks. However, our above-mentioned check-bits generating circuit has the following defects. When it is intended to construct the check-bits generating circuit by utilizing a single LSI (Large Scale Integration) chip, this single LSI chip must be mounted with about six hundred gate circuits and provided with about eighty input/output pins. In reality, a conventional LSI chip can be provided with at most about four hundred gate circuits mounted thereon and provided with at most seventy input/output pins. Consequently, the check-bits generating circuit of the prior art must be divided into at least two circuit units so that each circuit unit can be constructed by utilizing a conventional LSI chip. There are two methods for dividing the check-bits generating circuit into two circuit units, each of which is constructed by utilizing the same conventional size LSI chip. However, in the first method, it is required to employ an additional operating circuit which functions to combine respective outputs from the two circuit units in order to produce check-bits. This feature is the defect of our above-mentioned check-bits generating circuit. In the second method, since the result obtained from one of the two circuit units is supplied to the other circuit unit, and an output is thereafter produced from the other of the two circuit units, it takes a relatively long time to produce check-bits. This feature is also a defect of our above-mentioned check-bits generating circuit.

SUMMARY OF THE INVENTION

An object of the present invention is to provide an error-checking and error-correcting system comprising a check-bits generating circuit which does not have any of the above-mentioned defects. In other words, the check-bits generating circuit of the present invention neither requires an additional operating circuit nor takes a relatively long time for producing check-bits.

Another object of the present invention is to form a check bits generating circuit with two identical circuit elements.

The present invention will be more apparent from the ensuing description with reference to the accompanying drawings, wherein like numerals refer to like parts throughout.

BRIEF DESCRIPTION OF THE DRAWINGS

FIG. 1 shows a first example of a check matrix utilized in a check-bits generating circuit which has already been proposed in Japanese Laid-opened Patent Application No. 52-123147;

FIG. 2 shows a second example of a check matrix utilized in a check-bits generating circuit which has already been proposed in Japanese Laid-opened Patent Application No. 52-123147;

FIG. 3 shows a check matrix according to the present invention and also schematically illustrates the process for creating this check matrix;

Figure 5:
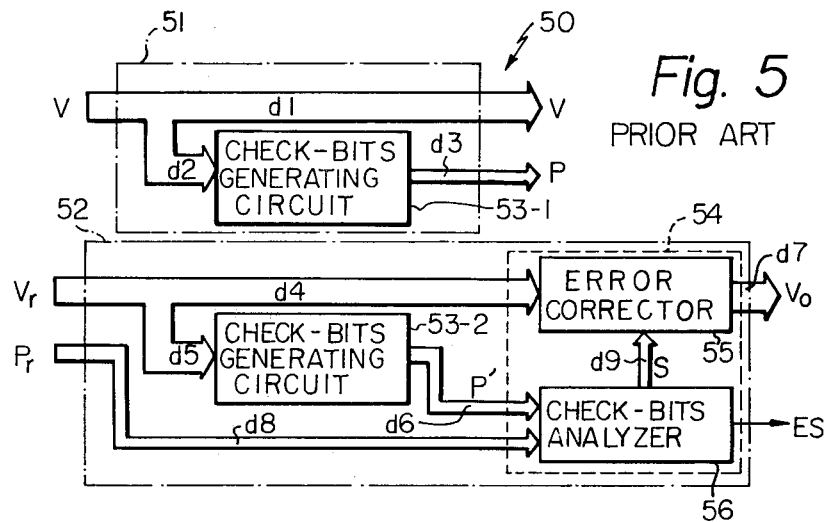
FIG. 5 is a block diagram representing a typical error-correcting and error-detecting system.
Figures 8, 14:
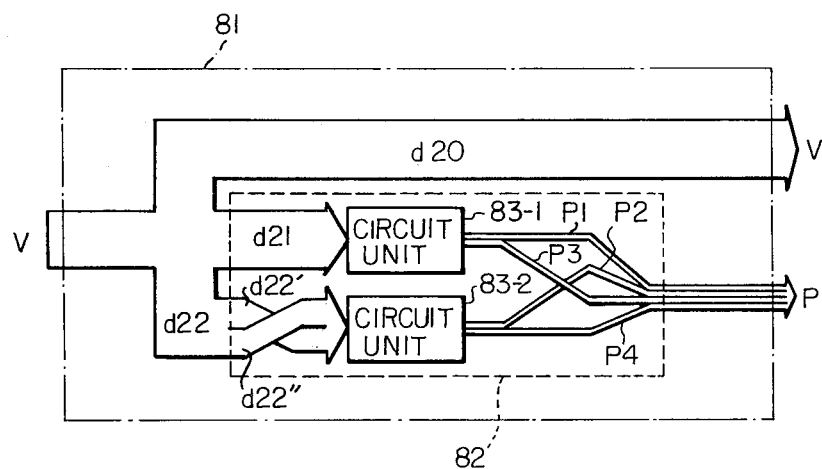
FIG. 8 is a block diagram representing a first example of a data recording division circuit 51 (shown in FIG. 5) which is comprised of a check-bits generating circuit according to the present invention.
Figure 11:
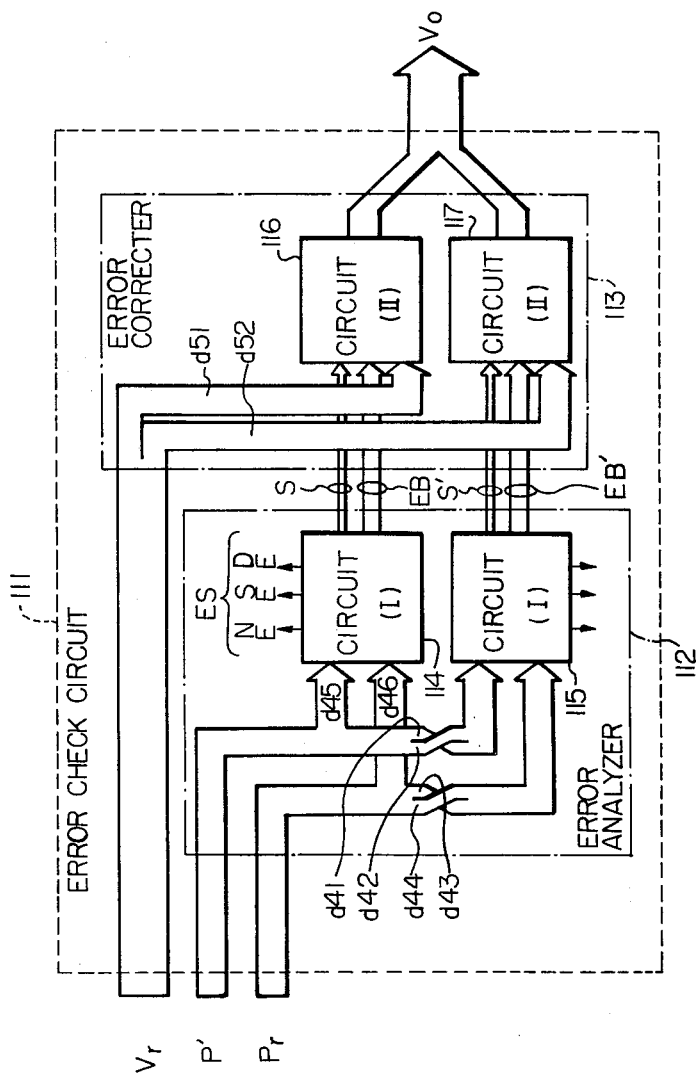
Figure 12A:
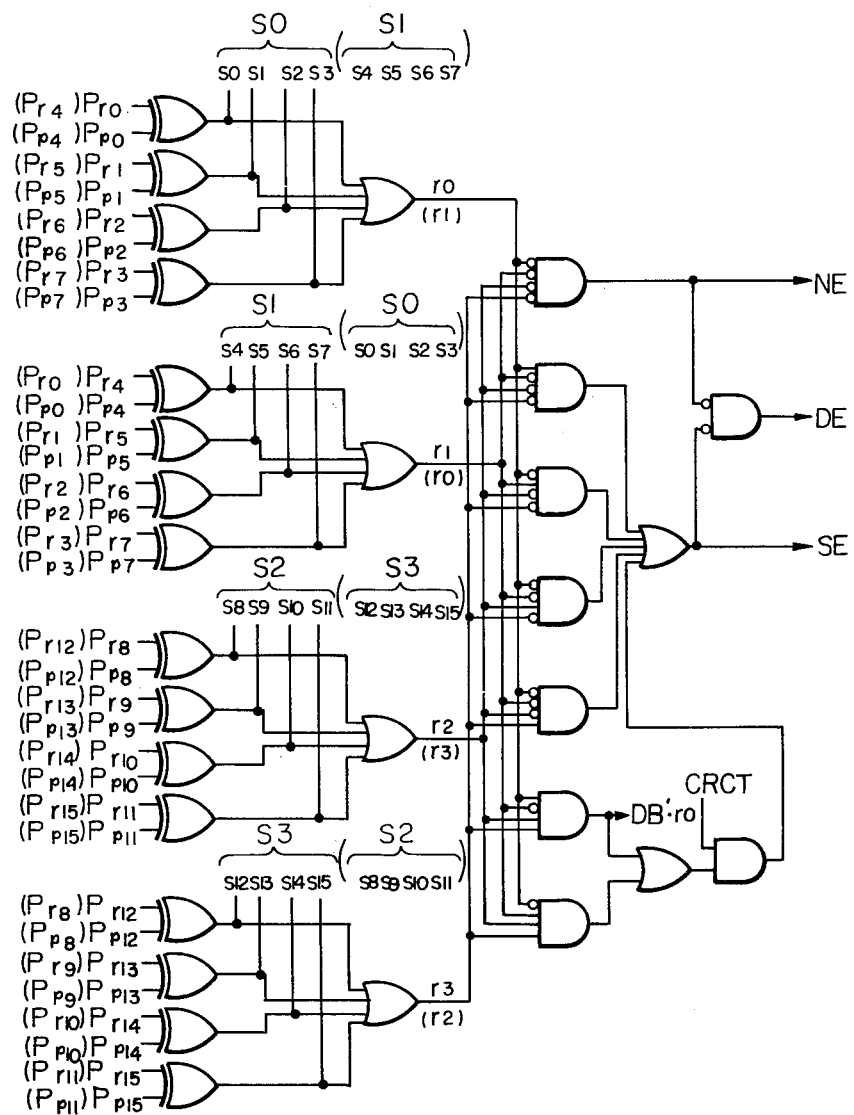
Figure 12D:
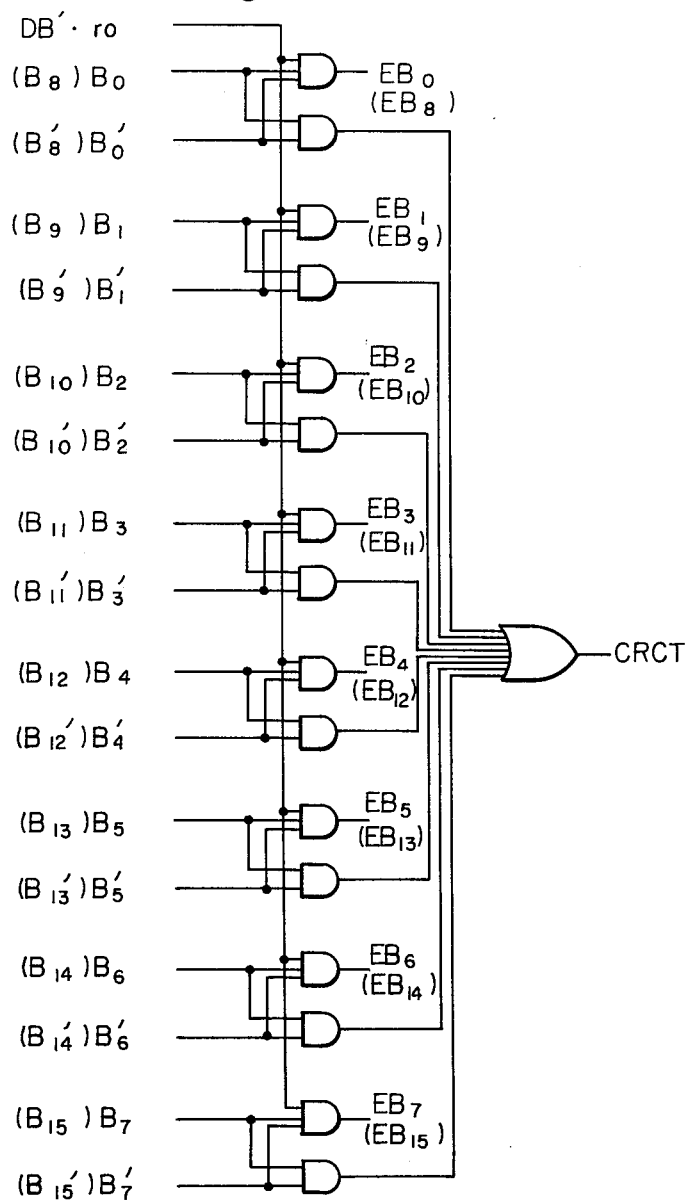
Figure 13:
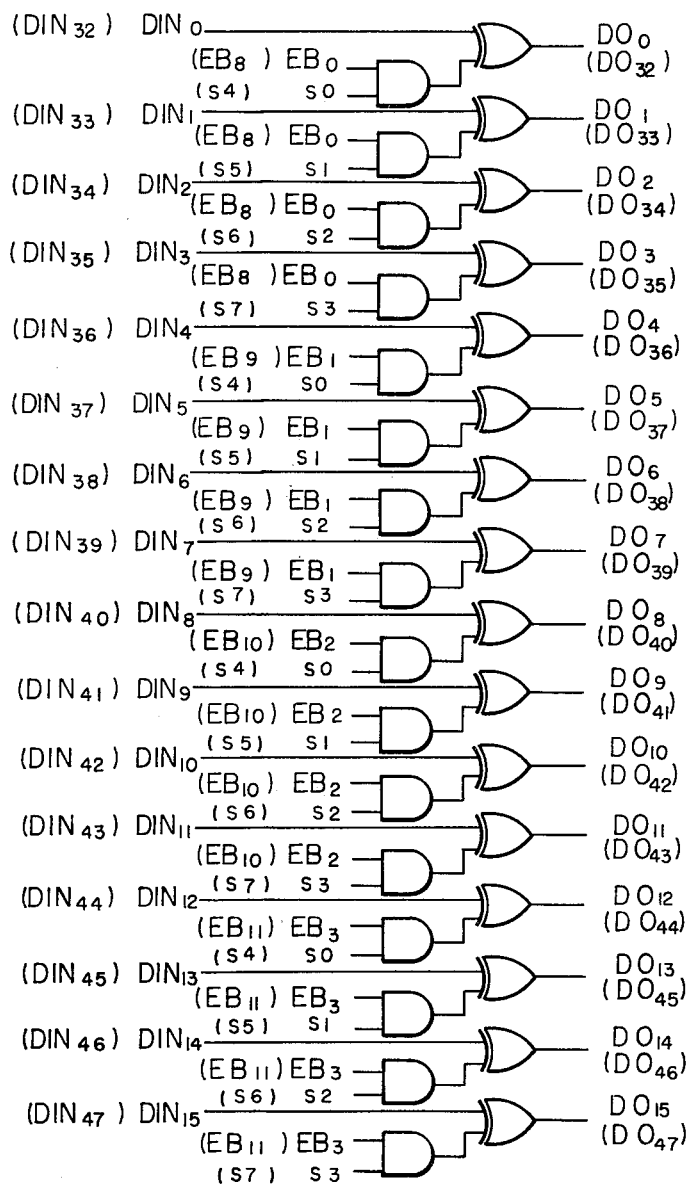

(shown in FIG. 5) which is comprised of a check-bits generating circuit according to the present invention;

FIGS. 10A, 10B, 10C, 10D and 10E respectively show a detailed circuit diagram of a circuit unit 83-1 (83-2) shown in FIG. 8;

FIG. 11 is a block diagram of an error check circuit 54 shown in FIG. 5, in the case wherein a check-bits generating circuit 53-2 (shown in FIG. 5) is constructed by using the same construction as that of a check-bits generating circuit according to the present invention;

FIGS. 12A, 12B, 12C and 12D respectively show a detailed circuit diagram of a circuit (I) 114(115) shown in FIG. 11;

FIG. 13 shows a detailed circuit diagram of a circuit (II) 116(117) shown in FIG. 11, and;

FIG. 14 shows a table indicating the error statuses with respect to the outputs $r_0$, $r_1$, $r_2$ and $r_3$ shown in FIG. 12A.

DESCRIPTION OF THE PREFERRED EMBODIMENTS

FIG. 1 shows a first example of a check matrix utilized in a check-bits generating circuit which has already been proposed in Japanese Laid-opened Patent Application No. 52-123147. This check-bits generating circuit is used in a b-bit single burst block error-correcting and double burst block error-detecting system. In FIG. 1, a check matrix 10 is comprised of a (k,l) type check matrix 11 and a parity check matrix 12. The check matrix 11 is further comprised of H-matrices $\boxed{O}$, $\boxed{I}$ and $\boxed{T}$.

The H-matrix $\boxed{O}$ represents the $$\text{matrix} \begin{bmatrix} 0 & 0 & 0 & 0 \\ 0 & 0 & 0 & 0 \\ 0 & 0 & 0 & 0 \\ 0 & 0 & 0 & 0 \end{bmatrix}.$$

The H-matrix $\boxed{I}$ represents the $$\text{matrix} \begin{bmatrix} 1 & 0 & 0 & 0 \\ 0 & 1 & 0 & 0 \\ 0 & 0 & 1 & 0 \\ 0 & 0 & 0 & 1 \end{bmatrix}.$$

The H-matrix $\boxed{T}$ represents the $$\text{matrix} \begin{bmatrix} 0 & 1 & 0 & 0 \\ 0 & 0 & 1 & 0 \\ 1 & 0 & 0 & 1 \\ 1 & 0 & 0 & 0 \end{bmatrix}.$$

The H-matrix $\boxed{T^n}$ (where n=0, 1, 2, 3, 4, 6, 8, 13, 14) is obtained by multiplying the H-matrix $\boxed{T}$ by itself n times.

Accordingly, the (k,l) type check matrix 11 is comprised of (16, 64) type check matrix, that is k=4×4=16 and l=4×16=64.

FIG. 2 shows a second example of a check matrix utilized in a check-bits generating circuit which has already been proposed in Japanese Laid-opened Patent Application No. 52-123147. In FIG. 2, a check matrix 20 is comprised of a (k,l) type check matrix 21 and the parity check matrix 12. The definitions of the H-matrices $\boxed{O}$, $\boxed{I}$, $\boxed{T}$ and $\boxed{T^n}$ have already been given hereinbefore. Therefore, this (k,l) type check matrix 21 is also a (16, 64) type check matrix.

As can be seen in FIGS. 1 and 2, each of the two check matrices 11 and 21 can easily be rearranged so as to have a symmetric arrangement. With respect to a central line L, for example, in FIG. 1, the check matrix 11 can have such a symmetric arrangement if the eight continuous H-matrices $\boxed{I}$ on the first row and the eight continuous H-matrices $\boxed{O}$ on the second row are interchanged. Also, for example, in FIG. 2, the check matrix 21 will have the above-mentioned symmetric arrangement if the incrementing H-matrices $\boxed{T}\boxed{T^1}\ldots\boxed{T^{14}}$ on the second row and the eight continuous H-matrices $\boxed{O}$ on the third row are interchanged.

By utilizing the check matrix 10 or 20 shown in FIG. 1 or FIG. 2, a check-bits generating circuit of a simple design can be constructed. However, as has already been mentioned before, the check-bits generating circuit of the prior art requires an additional operating circuit or takes a relatively long time for producing check-bits. This point will be clarified hereinafter by referring to FIGS. 6 and 7.

For the purpose of eliminating the above-mentioned defects, the present invention provides a unique check matrix as shown in FIG. 3. FIG. 3 indicates a check matrix according to the present invention and also schematically illustrates the process for creating this check matrix. In FIG. 3, the reference numeral 30 represents a check matrix according to the present invention. The check matrix 30 is comprised of the parity check matrix 12 and the (16, 64) type check matrix 31. The definitions of the H-matrices $\boxed{O}$, $\boxed{I}$, $\boxed{T}$ and $\boxed{T^n}$ have already been given hereinbefore. This check matrix 30 is composed by utilizing the following process. Firstly, an (m, l) type reference sub-matrix 32 (where m<k) is determined by the formula disclosed in the previously mentioned technical reports. The reference sub-matrix 32 is composed of (m, n) type unit-matrices 33 and 34 (where n<l). Secondly, sub-matrix 35 is created from the reference sub-matrix 32. That is, the unit-matrix 33 which is located on the left hand side of the reference sub-matrix 32 is shifted along an arrow A by a circular shift. The unit-matrix 33 is then located on the right hand side of the sub-matrix 35. Similarly, the unit-matrix 34 is shifted along a dotted arrow B'. However, since the unit-matrix 34 is located on the right end columns of the reference sub-matrix 32, the unit-matrix 34 is shifted along an arrow B by a circular shift. The unit-matrix 34 is then located on the left hand side of the sub-matrix 35. Thirdly, the first row of the matrices of the reference sub-matrix 32 is located on a first row 31①of the check matrix 31. Fourthly, a first row of matrices of the sub-matrix 35 is located on a second row 31②of the check matrix 31; a second row of matrices of the reference sub-matrix 32 is located on a third row 31③of the check matrix 31; and a second row of matrices of the sub-matrix 35 is located on a fourth row 31④of the check matrix 31, respectively, by means of reciprocal replacement. Then the (16, 64) type check matrix 31 is completed. Finally, the check matrix 30 is completed by adding the parity check matrix 12 to the check matrix 31. Hereinafter, how the check matrix 31 can be used to overcome the above-mentioned defects will be explained with reference to FIG. 8.

Figure 4:
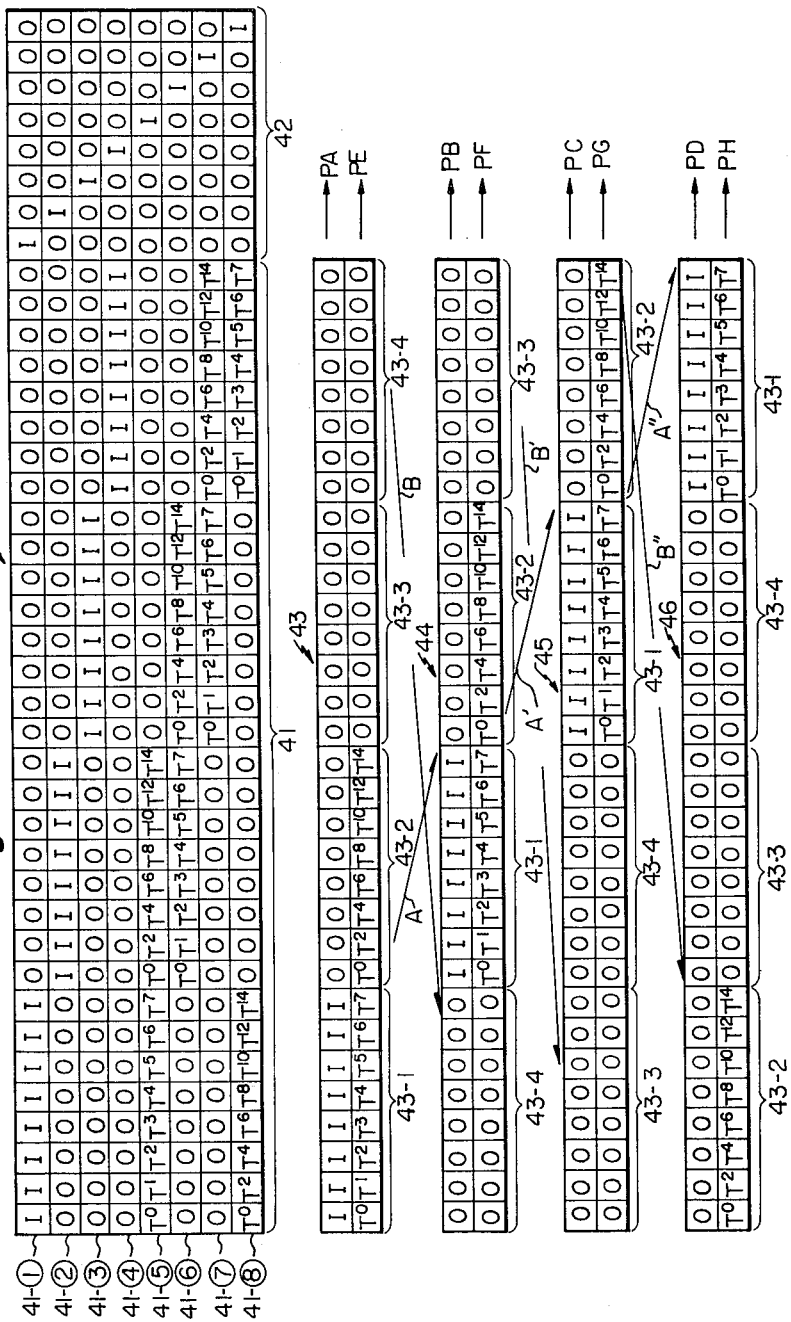
FIG. 4 shows another check matrix according to the present invention and also schematically illustrates the process for creating this check matrix.

The arrangement of the new check matrix is not limited to the arrangement designated by the reference numeral 31 in FIG. 3. Accordingly, another arrangement of the check matrix may also be created. For example, the check matrix 40 shown in FIG. 4 may also be used. FIG. 4 indicates another embodiment of the check matrix according to the present invention and also schematically illustrates the process for creating this check matrix. In FIG. 4, the check matrix 40 is comprised of a (32, 128) type check matrix 41 and a parity check matrix 42. The definitions of H-matrices $\boxed{O}$, $\boxed{I}$, $\boxed{T}$ and $\boxed{T^i}$ have already been given hereinbefore. This check matrix 40 is composed by using a process similar to the process mentioned with reference to FIG. 3. Firstly, a reference sub-matrix 43 is determined by a formula disclosed in the previously mentioned technical reports. A sub-matrix 44 is created from the reference sub-matrix 43 by the above-mentioned circular shift. A sub-matrix 45 is created from the sub-matrix 44 by the above-mentioned circular shift. A sub-matrix 46 is created from the sub-matrix 46 by the above-mentioned circular shift. The reference sub-matrix 43 is composed of unit-matrices 43-1, 43-2, 43-3 and 43-4. The unit-matrices 43-1, 43-2, and 43-3 of the reference sub-matrix 43 are shifted along an arrow A, and the unit-matrix 43-4 is shifted along an arrow B. Accordingly, the sub-matrix 44 is created. Similarly, the unit matrices 43-4, 43-1 and 43-2 are shifted along an arrow A' and the unit matrix 43-3 is shifted along an arrow B'. Then the sub-matrix 45 is created. Furthermore, the unit-matrices 43-3, 43-4 and 43-1 are shifted along an arrow A'', and the unit-matrix 43-2 is shifted along an arrow B''. As a result, the sub-matrix 46 is created. Next, a first row and a second row of the reference sub-matrix 43 are, respectively, located on a first row 41-① and a fifth row 41-⑤ by the above-mentioned reciprocal replacement. A first row and a second row of the sub-matrix 44 are, respectively, located on a second row 41-② and a sixth row 41-⑥ by the reciprocal replacement. A first row and a second row of the sub-matrix 45 are, respectively, located on a third row 41-③ and a seventh row 41-⑦ by the reciprocal replacement. A first row and a second row of the sub-matrix 46 are, respectively, located on an fourth row 41-④ and a eighth row 41-⑧ by the reciprocal replacement. Thus, the (32, 128) type check matrix 41 is completed.

An error-correcting and error-detecting system which is comprised of the check-bits generating circuits will now be explained. FIG. 5 is a block diagram representing a typical error-correcting and error-detecting system. In FIG. 5, the error-correcting and error-detecting system 50 is constructed mainly of both a data recording division circuit 51 and a data reproducing division circuit 52. The data recording division circuit 51 is comprised of a check-bits generating circuit 53-1 and data buses d1, d2 and d3. The data reproducing division circuit 52 is comprised of a check-bits generating circuit 53-2, an error check circuit 54 and data buses d4, d5, d6, d7, d8 and d9. Write data V is supplied to the data recording division circuit 51, and is supplied to the check-bits generating circuit 53-1 by way of the data bus d2. Then the check-bits generating circuit 53-1 generates check bits corresponding to the write data V, and produces a check-bits code P by way of the data bus d3. Write data V is also outputted from the data recording division circuit 51 by way of the data bus d1. Thus, the check-bits code P is outputted with the write data V. The result of (V+P) is then stored in, for example, a large capacity memory system (not shown).

When the data corresponding to (V+P) is read out from the large capacity memory system, the read-out data ($V_r$+$P_r$) is applied to the data buses d4 and d8, respectively, in the data reproducing division circuit 52. The read-out data $V_r$ is applied to the check-bits generating circuit 53-2 by way of the data bus d5. Then, the check-bits generating circuit 53-2 generates a check bits code P, corresponding to the read-out data $V_r$. This check bits code P' is then applied to a check-bits analyzer 56 in the error check circuit 54 by way of the data bus d6. The read-out check-bits code $P_r$ is also applied to the check-bits analyzer 56 by way of the data bus d8. The check-bits analyzer 56 produces a well-known syndrome S and also error-status information ES. If the read-out data $V_r$ transferred onto the data bus d4 contains an error bit or error bits, these errors are corrected in an error corrector 55 by using the syndrome S transmitted by way of the data bus d9. If there are any errors in the read-out data $V_r$, corrected read-out data $V_o$ is outputted from the data bus d7. At the same time, an error status ES is also produced and outputted.

It should be noted that, in the error-correcting and error-detecting system 50, the present invention is specifically applied to the check-bits generating circuits such as 53-1 and 53-2 in FIG. 5. In the check-bits generating circuit the check-bits code P is produced by multiplying the write data V with by the check matrix which is, for example, shown in FIGS. 1, 2, 3 and 4. Also, in the check-bits generating circuit 53-2, the check-bits code P' is produced by multiplying the read-out data $V_r$ by the check matrix which is, for example, shown in FIGS. 1, 2, 3 and 4. According to the following very simple explanatory example, suppose that the write data V or the read-out data $V_r$ is represented by $$\begin{bmatrix} 0 \\ 1 \\ 1 \\ 0 \end{bmatrix}.$$

and the check matrix is represented by $$\begin{bmatrix} 1 & 1 & 1 & 0 \\ 0 & 1 & 1 & 1 \\ 1 & 1 & 0 & 1 \end{bmatrix},$$

the check-bits code P or P' will be represented by $$\begin{bmatrix} 0 \\ 0 \\ 1 \end{bmatrix}$$

obtained from the following equation:

$$\begin{bmatrix} 1 & 1 & 1 & 0 \\ 0 & 1 & 1 & 1 \\ 1 & 1 & 0 & 1 \end{bmatrix} \begin{bmatrix} 0 \\ 1 \\ 1 \\ 0 \end{bmatrix} = \begin{bmatrix} 0 \\ 0 \\ 1 \end{bmatrix}.$$

Figure 6:
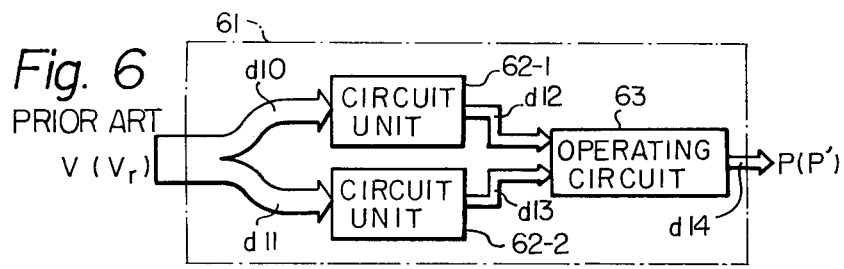
FIG. 6 is a block diagram showing a first example of a check-bits generating circuit which has already been proposed in Japanese Laid-opened Patent Application No. 52-123147.
Figure 7:
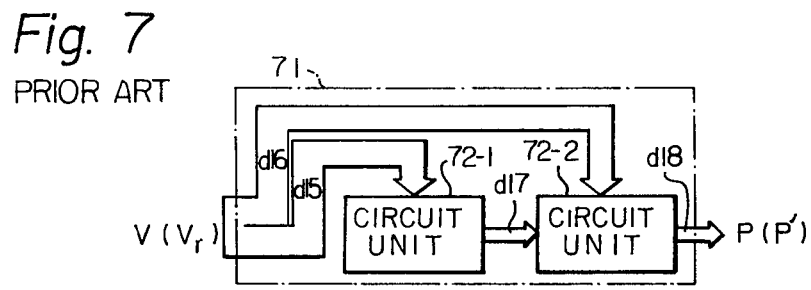
FIG. 7 is a block diagram showing a second example of a check-bits generating circuit which has already been proposed in Japanese Laid-opened Patent Application No. 52-123147.

For constructing the check-bits generating circuit 53-1 (or 53-2) by utilizing a single LSI chip, about six hundred gate circuits and about eighty input/output pins must be mounted on the single LSI chip. As previously mentioned, since about four hundred gate circuits at most and about seventy input/output pins at most can be mounted on a conventional LSI chip, the check-bits generating circuit 53-1 (or 53-2) has to be divided into two circuit units. There are two methods for dividing the check-bits generating circuit 53-1 (or 53-2) into two circuit units. FIG. 6 is a block diagram showing a check-bits generating circuit which has already been proposed in Japanese Laid-opened Patent Application No. 52-123147. This circuit is constructed according to the first of these two methods. FIG. 7 is a block diagram showing a check-bits generating circuit which also has already been proposed in Japanese Laid-opened Patent Application No. 52-123147. This circuit is constructed according to the second of these two methods. In FIG. 6, a check-bits generating circuit 61 is comprised of a first circuit unit 62-1, a second circuit unit 62-2, an additional operating circuit 63 and data buses d10, d11, d12, d13 and d14. Each of the circuit units 62-1 and 62-2 is constructed by utilizing a conventional LSI chip. The data V ($V_r$) is divided into two data units and the two data units which are applied to the circuit units 62-1 and 62-2 by way of the data buses d10 and d11. Since the check bits are respectively produced from the circuit units 62-1 and 62-2, the operating speed of the check-bits generating circuit 61 is relatively high. However, an additional operating circuit 63 for combining the check-bits transmitted over the data buses d12 and d13 is required. Thus, the check bits code P (P') is obtained from the additional operating circuit 63. In FIG. 7, a check-bits generating circuit 71 is comprised of a first circuit unit 72-1, a second circuit 72-2 and data buses d15, d16, d17 and d18. First, the data V ($V_r$) transmitted over the data bus d15 is applied to the first circuit unit 72-1. Second, the data V ($V_r$) transmitted over the data bus d16 is applied to the second circuit unit 72-2. Since the second circuit unit 72-2 produces the check-bits code P (P') from the data bus d18 by using the result transmitted over the data bus d17 from the first circuit unit 72-1, it takes a relatively long time for the check-bits generating circuit 71 to produce the check-bits code P (P').

As mentioned above, each of the proposed check-bits generating circuits has its own defects. In contrast, the check-bits generating circuit according to the present invention has no such defects, because the check-bits generating circuit is formed by means of the check matrix shown in FIG. 3 or FIG. 4.

FIG. 8 is a block diagram showing one example of a data recording division circuit comprising a check-bits generating circuit according to the present invention. In FIG. 8, the reference numeral 81 indicates a data recording division circuit which corresponds to the data recording division circuit 51 shown in FIG. 5. The data recording division circuit 81 comprises data buses d20, d21, d22 and a check-bits generating circuit 82 constructed according to the present invention. The reference symbol V indicates the write data and the reference symbol P indicates a check-bits code. It should be noted that the check-bits generating circuit 82 is constructed according to the check matrix 30 shown in FIG. 3. The check-bits generating circuit 82 comprises two units 83-1 and 83-2, which circuit are constructed by using identical LSI chips. However, the check-bits generating circuit 82 does not include an additional operating circuit which is similar to the circuit 63 shown in FIG. 6. The reason why the check-bits generating circuit 82 includes no additional operating circuit is that the circuit 82 is constructed based on the check matrix 31 shown in FIG. 3. As previously mentioned in FIG. 3, the check matrix 31 is made up of the reference sub-matrix 32 and the sub-matrix 35. Referring to both FIGS. 3 and 8, the data bus d21 and the circuit unit 83-1 in FIG. 8 are constructed in accordance with reference sub-matrix 32 in FIG. 3, and the reversed data buses d22', d22" and the circuit unit 83-2 in FIG. 8 are constructed in accordance with sub-matrix 35 in FIG. 3. In FIG. 3, when the write data is multiplied by the reference sub-matrix 32, the first row thereof produces a first check-bits code P1 (see P1 in FIG. 8), and the second row thereof produces a third check-bits code P3 (see P3 in FIG. 8). Similarly, when the write data is multiplied by the sub-matrix 35, the first row thereof produces a second check-bits code P2 (see P2 in FIG. 8), and the second row thereof produces a fourth check-bits code P4 (see P4 in FIG. 8). Then, in FIG. 8, the check-bits code P is obtained by rearranging the corresponding data buses of the first through the fourth check-bits codes P1 through P4, without using an additional operating circuit such as to the circuit 63 shown in FIG. 3. The operating speed of the check-bits generating circuit 82 is much higher than the operating speed of the check-bits generating circuit 61 shown in FIG. 6, because the check-bits code P is produced during one operational step conducted simultaneously in the circuit units 83-1 and 83-2. In FIG. 8, when the write data V is comprised of 64 bits of data, i.e., $\{D_0, D_1 \ldots D_{63}\}$, the first check-bits code P1 is comprised of check bits $\{CB_0, CB_1, CB_2, CB_3\}$; the second check-bits code P2 is comprised of check-bits $\{CB_4, CB_5, CB_6, CB_7\}$; the third check-bits code P3 is comprised of check-bits $\{CB_8, CB_9, CB_{10}, CB_{11}\}$ and the fourth check-bits code P4 is comprised of check-bits $\{CB_{12}, CB_{13}, CB_{14}, CB_{15}\}$. These symbols $\{D_0, D_1 \ldots D_{63}\}$ and $\{CB_0, CB_1, \ldots CB_{15}\}$ will be explained in detail below.

In FIG. 8, the write data $\{D_0, D_1 \ldots D_{63}\}$ is applied to the circuit unit 83-1 by way of the data bus d21, and the first and third check-bits codes P1 and P3 are thereby obtained therefrom. On the other hand, the reversed write data $[\{D_{32}, D_{33} \ldots D_{63}\}\{D_0, D_1 \ldots D_{31}\}]$ is applied to the circuit unit 83-2 by way of the reversed data buses d22' and d22", and the second and fourth check-bits codes P2 and P4 are thereby obtained therefrom. It can be assumed that the exchange of unit-matrices 33 and 34 along arrows A and B in FIG. 3 is achieved by reversing the data buses d22' and d22".

Figure 9:
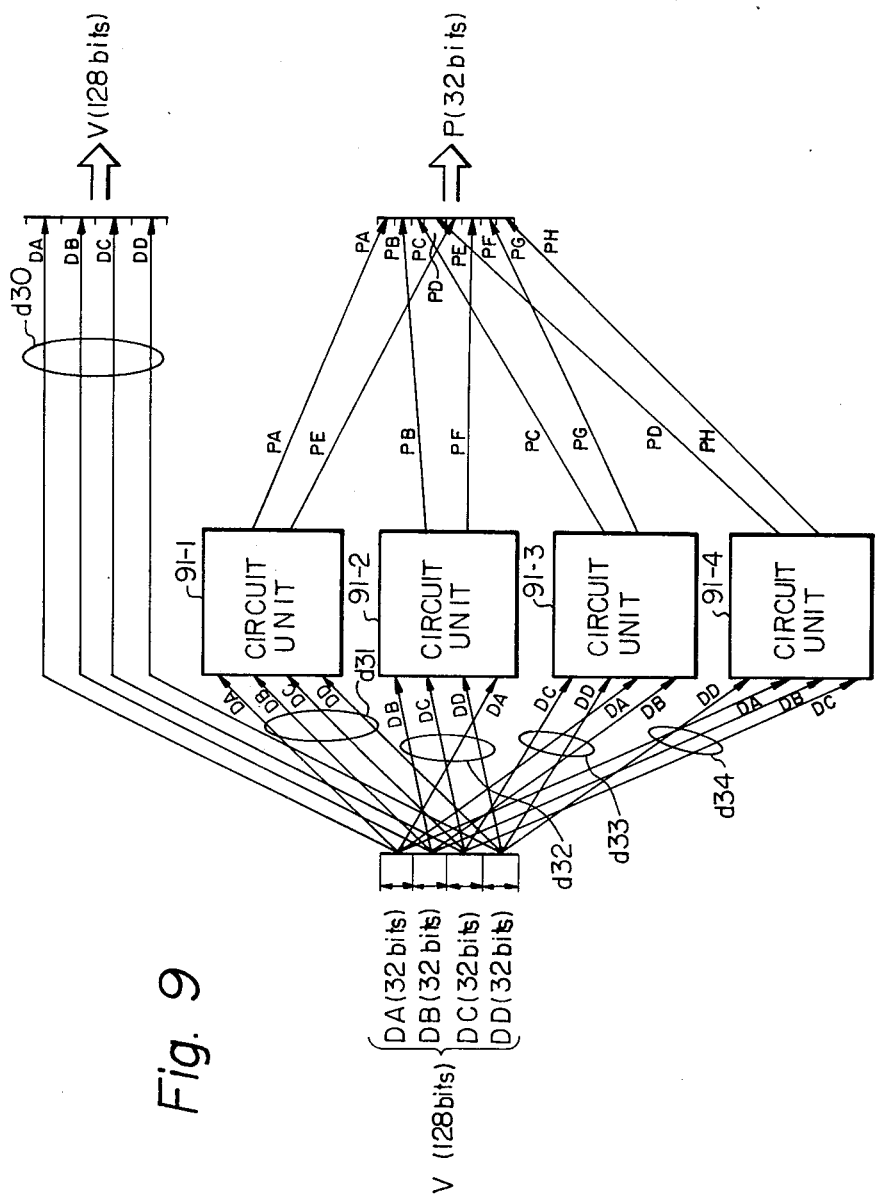
FIG. 9 is a schematic block diagram illustrating a second example of a data recording division circuit 51
Figure 10A:
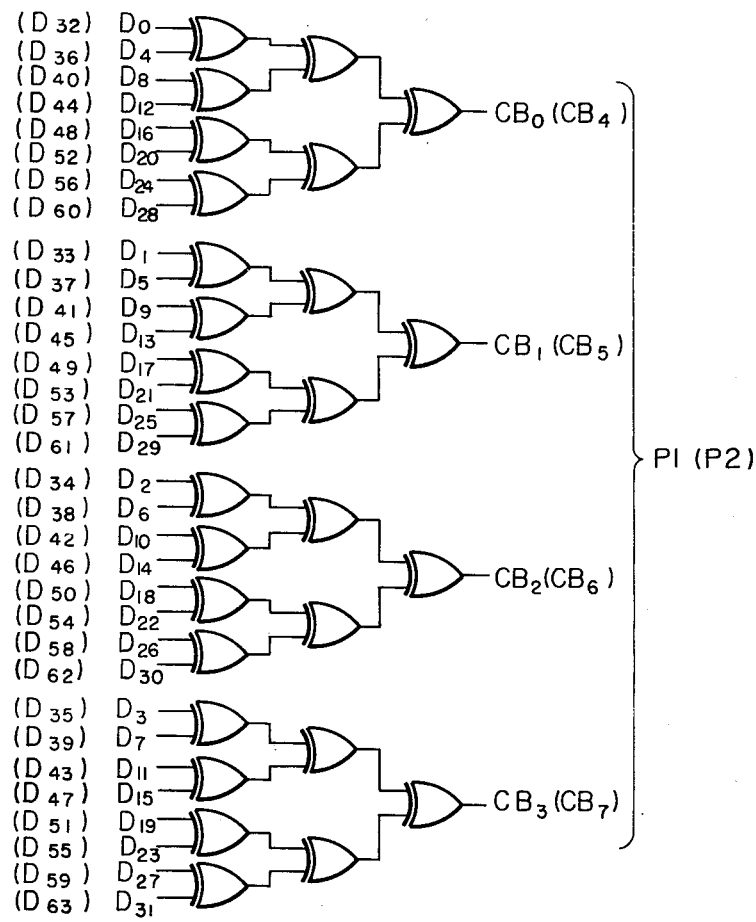
Figure 10B:
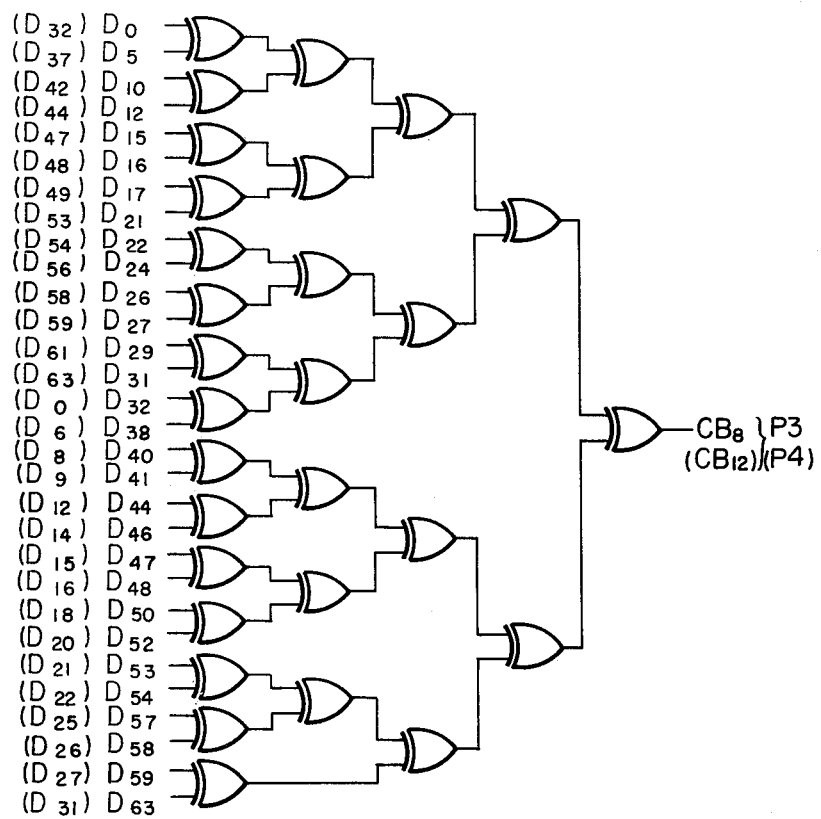
Figure 10C:
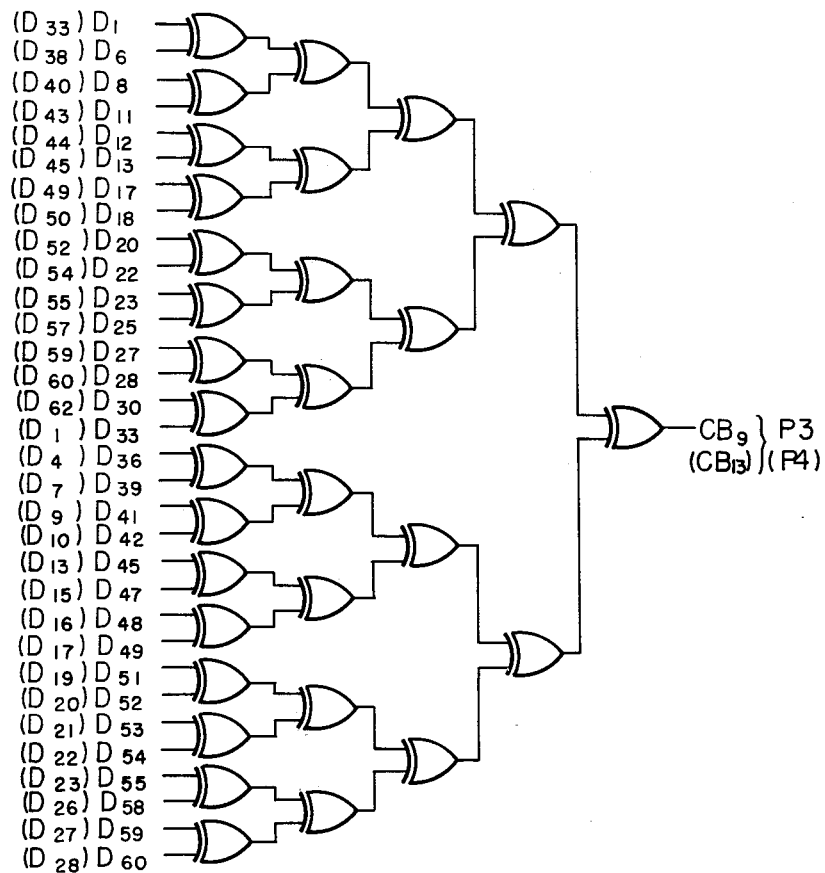
Figure 10:
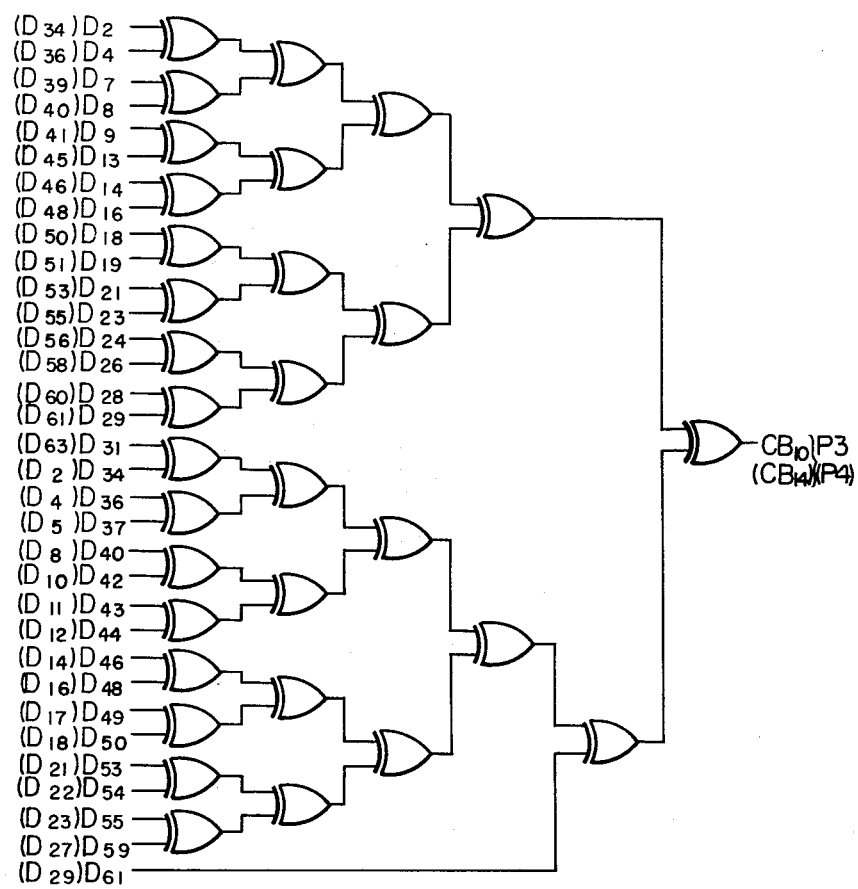
Figure 10E:
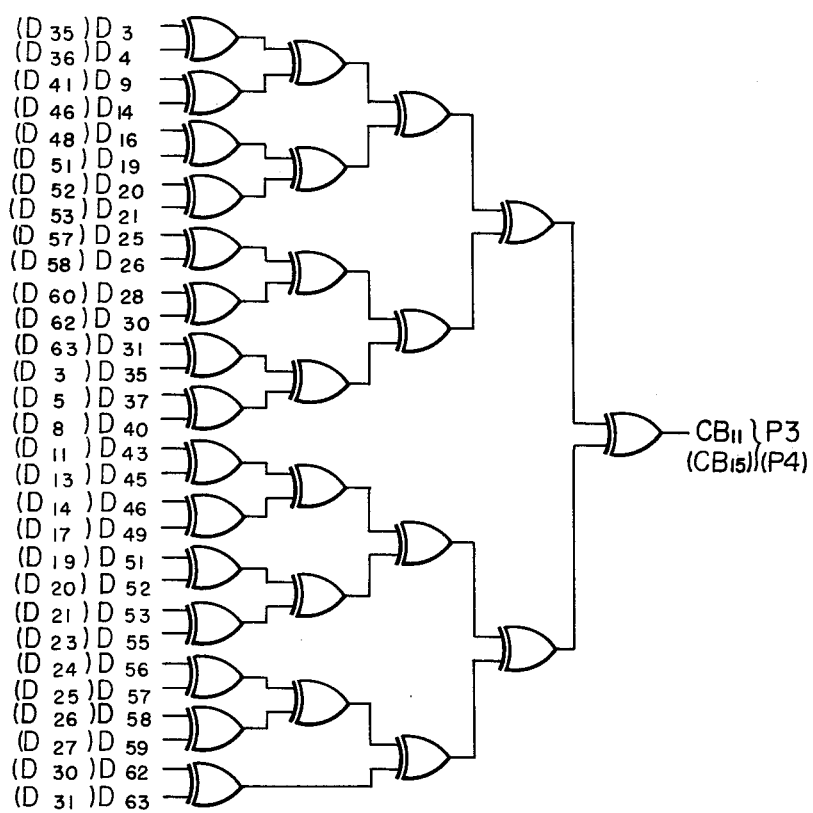

The check-bits generating circuit 82 shown in FIG. 8 is constructed based on the check matrix 31 shown in FIG. 3. A check-bits generating circuit based on the check matrix 41 shown in FIG. 4 can be constructed in a similar manner. FIG. 9 is a schematic block diagram illustrating a second example of a data recording division circuit 51 (FIG. 5) which is comprised of a check-bits generating circuit based on the check matrix 41 shown in FIG. 4. As previously mentioned, in FIG. 4 the check matrix 41 is made of the reference sub-matrix 43, and sub-matrices 44, 45 and 46. Referring to both FIGS. 4 and 9, a data bus d31 and a circuit unit 91-1 in FIG. 9 are constructed in accordance with reference sub-matrix 43 in FIG. 4; a data bus d32 and a circuit unit 91-2 in FIG. 9 are constructed in accordance with sub-matrix 44 in FIG. 4. Data bus d33 and circuit unit 91-3 in FIG. 9 are constructed in accordance with sub-matrix 45 in FIG. 4; and the sub-matrix 46 in data bus d34 and circuit unit 91-4 in FIG. 9 are constructed in accordance with sub-matrix 46 in FIG. 4. In FIG. 4, when the write data is multiplied by the reference sub-matrix 43, the first and second rows thereof produce the first and the fifth check-bits codes PA and PE, respectively, (see PA, PE in FIG. 9). Check-bits codes (PB, PF), (PC, PG), (PD, PH), in FIG. 4 are also obtained in a similar way as mentioned above (see corresponding (PB, PF), (PC, PG), (PD, PH) in FIG. 9). Then, in FIG. 9, the check-bits code P (32 bits) is obtained by rearranging the corresponding data buses of the first through the eight check-bits codes PA through PH without using an additional operating circuit similar to the circuit 63 shown in FIG. 6. The data bus d30 transmits input write data V (128 bits) to be supplied for example, to a memory system (not shown).

In FIGS. 8 and 9, new circuit units 83-1, 83-2, 91-1 through 91-4 are illustrated. Details of the circuit unit, for example, of the circuit unit 83-1 shown in FIG. 8, will now be explained. FIGS. 10A through 10E show detailed circuit diagrams of the circuit unit 83-1 shown in FIG. 8. It should be noted that the other circuit unit 83-2 shown in FIG. 8 has the same circuit diagrams as those shown in FIGS. 10A through 10E. The difference between the circuit units 83-1 and 83-2 is that, as seen from FIG. 8, the circuit unit 83-1 receives the write data $\{D_0, D_1 \ldots D_{63}\}$ and produces the first and the third check-bits codes P1 and P3, respectively, while the circuit unit 83-2 receives the write data $[\{D_{32}, D_{33} \ldots D_{63}\} \{D_0, D_1 \ldots D_{31}\}]$ and produces the second and the fourth check-bits codes P2 and P4, respectively. The logic circuit of FIG. 10A which is comprised of EXCLUSIVE-OR gates receives write data $\{D_0, D_4, D_8 \ldots D_{31}\}$ and produces the previously mentioned check-bits $\{CB_0, CB_1, CB_2, CB_3\}$ which comprise the first check-bits code P1. On the other hand, the logic circuit of FIG. 10A used in the circuit unit 83-2 (FIG. 8) receives the write data $\{D_{32}, D_{36}, D_{40} \ldots D_{59}, D_{63}\}$ and produces check-bits $\{CB_4, CB_5, CB_6, CB_7\}$ which comprise the second check-bits code P2. The symbols corresponding to the circuit unit 83-2 are indicated in respective parentheses shown in FIG. 10A.

In FIGS. 10B through 10E, each of the logic circuits shown is comprised of EXCLUSIVE-OR gates for producing check-bits $CB_8$, $CB_9$, $CB_{10}$ and $CB_{11}$, each of which comprises the third check-bits code P3. The logic circuit of FIG. 10B receives the write data $\{D_0, D_5, D_{10} \ldots D_{59}, D_{63}\}$; the logic circuit of FIG. 10C receives the write data $\{D_1, D_6, D_8 \ldots D_{59}, D_{60}\}$; the logic circuit of FIG. 10D receives the write data $\{D_2, D_4, D_7 \ldots D_{59}, D_{61}\}$, and the logic circuit of FIG. 10E receives the write data $\{D_3, D_4, D_9, \ldots D_{62}, D_{63}\}$. On the other hand the logic circuits of FIGS. 10B through 10E used in the circuit unit 83-2 (FIG. 8), respectively, produce check bits $CB_{12}$, $CB_{13}$, $CB_{14}$ and $CB_{15}$ which comprise the fourth check bits code P4. In this case, the logic circuits of FIGS. 10B through 10E, respectively, receive the write data $\{D_{32}, D_{37} \ldots \}$, $\{D_{33} D_{38} \ldots \}$, $\{D_{34}, D_{36} \ldots \}$ and $\{D_{35}, D_{36} \ldots \}$, wherein the symbols {corresponding to circuit unit 83-2} are placed inside parentheses in FIGS. 10B through 10E, respectively.

As is apparent from the above description, the check-bits generating circuit according to the present invention does not require any additional operating circuit which is similar to the circuit 63 shown in FIG. 6, and furthermore, it takes a very short time to produce the check-bits code P (P1, P2, P3 and P4). In the data reproducing division circuit 52 shown in FIG. 5, the check-bits generating circuit 53-2 may also be constructed by using the same construction as the check-bits generating circuit 82 according to the present invention shown in FIG. 8. In the case where the check-bits generating circuit 53-2 is constructed by using the same construction as the check-bits generating circuit 82 shown in FIG. 8, the error check circuit 54 should be accordingly modified. In regard to FIG. 11, the definitions of the symbols $V_r$, $P_r$, P' and ES have already been given with reference to FIG. 5. An error check circuit 111 corresponds to the error check circuit 54 in FIG. 5, a check-bits analyzer 112 corresponds to the check-bits analyzer 56 in FIG. 5, and an error corrector 113 corresponds to the error corrector 55 in FIG. 5. The check-bits analyzer 112 comprises two exactly identical circuits (I) 114 and 115. The error corrector 113 comprises two exactly identical circuits (II) 116 and 117. The circuit (I) 114 receives the newly produced check-bits code P' and the read-out check-bits code $P_r$. Then the circuit (I) 114 produces the error-status information ES including a non-error indication signal NE, a double burst error indication signal DE and a single burst error indication signal SE, a syndrome S and error block code EB. The syndrome S and error block code EB are then applied to the circuit (II) 116. On the other hand, the circuit (I) 115 receives the newly produced check-bits code P' and the read-out check-bits code $P_r$, where one half of P' and another half of P' are exchanged by means of reversed data buses (d41, d42), and one half of $P_r$ and another half of $P_r$ are exchanged by means of reversed data buses (d43, d44). Then, the circuit (I) 115 produces a syndrome S' and an error block code EB'. The syndrome S' and the error block code EB' are than applied to the circuit (II) 117. As a result, the corrected read-out data $V_o$ is obtained.

FIGS. 12A through 12D show detailed circuit diagrams of the circuit (I) 114 shown in FIG. 11. It should be noted that the other circuit (I) 115 shown in FIG. 11 has the same circuit diagrams as those shown in FIGS. 12A through 12D. The difference between the circuits (I) 114 and 115 is that, as mentioned above, the bit locations of the input and output data corresponding to the circuit (I) 115 are inverted with respect to the bit locations of the circuit (I) 114. In FIG. 12A, the bits $P_{p0}$, $P_{p1}$, $P_{p3} \ldots P_{p14}$ and $P_{p15}$ comprise the newly produced check-bits code P' transmitted over a data bus d45 shown in FIG. 11. The bits $P_{r0}$, $P_{r1}$, $P_{r3} \ldots P_{r14}$ and $P_{r15}$ comprise the read-out check-bits code $P_r$ transmitted over a data bus d46 shown in FIG. 11. The bits (s0, s1, s2, s3,) comprise the syndrome S0; the bits (s4, s5, s6, s7) comprise the syndrome S1; the bits (s8, s9, s10, s11) comprise the syndrome S2; and the bits (s12, s13, s14, s15) comprise the syndrome S3. The syndrome S0 corresponds to the syndrome S shown in FIG. 11. The outputs $r_0$, $r_1$, $r_2$, and $r_3$ are respectively produced from the respective OR-gates by utilizing the following mathematical equations:

$r_0 = s0^V s1^V s2^V s3$
$r_1 = s4^V s5^V s6^V s7$
$r_2 = s8^V s9^V s10^V s11$
$r_3 = s12^V s13^V s14^V s15$ where the symbol V represents the OR-function. The DB'.$r_0$ is applied to the logic circuit output shown in FIG. 12D. The input CRCT (correct) is supplied from the logic circuit shown in FIG. 12D. The output error-status information ES including the aforesaid signals NE, DE and SE have already been explained with reference to FIG. 11. On the other hand, the corresponding signals which are applied to the circuit (I) 115 of FIG. 11 and the corresponding signals which are produced therefrom are indicated by the symbols in the parentheses shown in FIG. 12A. Accordingly, the syndrome (S1) shown in FIG. 12A is represented by the syndrome S' shown in FIG. 11.

In FIG. 12B, the symbols $T^0$, $T^1$, $T^2$, $T^3$, $T^4$, $T^5$, $T^6$, and $T^7$, designate H-matrices which were already explained above with reference to FIGS. 1, 2 and 3. The input syndrome bits s0, s1, s2, ... s15 shown in FIG. 12B are applied from the logic circuit shown in FIG. 12A. On the other hand, the output bits $B_0'$ through $B_7'$ and the output bits $(B_8')$ through $(B_{15}')$ are applied to the logic circuit shown in FIG. 12D. The logic circuit of FIG. 12C receives selected syndrome bits shown in FIG. 12A and produces the output bits $B_0$ through $B_7$ and $(B_8)$ through $(B_{15})$, which output bits are also applied to the circuit diagram shown in FIG. 12D. Then, the logic circuit of FIG. 12D produces an error block code EB comprised of bits $EB_0$ through $EB_7$. Such produced error block code EB is shown in FIG. 11. The error block code EB' comprised of bits $(EB_8)$ through $(EB_{15})$ is also shown in FIG. 11. The error block codes EB and EB' indicate a data block containing one or more error bits.

FIG. 13 shows a detailed circuit diagram of the circuit (II) 116 shown in FIG. 11. It should be noted that the other circuit (II) 117 shown in FIG. 11 has the same circuit diagrams shown in FIG. 13. In FIG. 13, the symbols $DIN_0$ through $DIN_{31}$ represent the read-out data $V_r$ transmitted over the data bus d51 in FIG. 11. The parenthesized symbols $(DIN_{32})$ through $(DIN_{63})$ represent the read-out data $V_r$ transmitted over the data bus d52 shown in FIG. 11. The syndrome bits are supplied from the logic circuit shown in FIG. 12A, and the error block code is supplied from the logic circuit shown in FIG. 12D. Thus, the corrected data bits $DO_0$ through $DO_{31}$ and the corrected data bits $(DO_{32})$ through $(DO_{63})$ are obtained. Both sets of corrected data bits comprise the corrected read-out data $V_0$ shown in FIG. 11. In FIG. 1, if the position of a data block containing an error is detected in the error check circuit 111 by utilizing a usual detecting process, then the bits in the error data block which caused the error can be further detected by utilizing the patterns of the syndromes S0 and S1. For example, when the check matrix 31 shown in FIG. 3 is used, an error pattern will occur in the syndrome S0 in the event that an error bit is contained in one of the data blocks $\{D_0, D_1, D_2, D_3,\}$, $\{D_4, D_5, D_6, D_7,\}$ through $\{D_{28}, D_{29}, D_{30}, D_{31}\}$. An error pattern will occur in the syndrome S1 in the event that an error bit is contained in one of the data blocks $\{D_{32}, D_{33}, D_{34}, D_{35}\}$, $\{D_{36}, D_{37}, D_{38}, D_{39}\}$ through $\{D_{60}, D_{61}, D_{62}, D_{63}, \}$. Specifically, suppose that the data block $\{D_0, D_1, D_2, D_3\}$ such as $\{1101\}$ is an error data block, and the syndrome S0 is $\{1100\}$, then the error data block is corrected to $\{0001\}$.

FIG. 14 shows a table which indicates various kinds of error statuses with respect to the outputs $r_0$, $r_1$, $r_2$ and $r_3$ shown in FIG. 12A. The error statuses NE, DE, and SE are represented by the signals NE, DE and SE, respectively, shown in FIG. 11 and also in FIG. 12A. For example, when the outputs $\{r_0, r_1, r_2, r_3\}$ corresponds to $\{0000\}$, the error status is NE. When the outputs $\{r_0, r_1, r_2, r_3\}$ correspond to one of the outputs $\{0011\}$ through $\{1111\}$, the error status is DE. When the outputs $\{r_0, r_1, r_2, r_3\}$ correspond to one of the outputs $\{1000\}$ through $\{0001\}$, the error status is SE.

The error status *1 indicates that, when the syndromes S2 and S0 satisfy the following equation:

$$S2 = T^i S0 \ (i = 0, 1 \ldots 7)$$

and, simultaneously, if a certain integer i exists which satisfies the following equation:

$$S3 = T^i S2,$$

then a single burst error SE exists in the i-th data block. If no such integer i which satisfies the above equation $S3 = T^i S2$ exists, then a double burst error exists in the data blocks.

The error status *2 indicates that, when the syndromes S3 and S1 satisfy the following equation:

$$S3 = T^i S1 \ (i = 0, 1 \ldots 7)$$

and, simultaneously, if a certain integer i exists which satisfies the following equation:

$$S2 = T^i S3$$

then a single burst error SE exists in the (i+8)-th data block. If no such i which satisfies the above equation $S2 = T^i S3$ exists, then a double burst error exists in the data blocks.

As mentioned above, the check bits generating circuit according to the present invention can be constructed by utilizing two exactly identical circuit units of LSI chips, without employing an additional operating circuit similar to the circuit 63 in FIG. 6. As a result of this construction, the operating speed of the check bits generating circuit is considerably higher than that of the check bits generating circuit 71 shown in FIG. 7, because the check-bits code P in FIG. 7 is produced sequentially in two operational steps conducted in the circuit units 72-1 and 72-2.

What is claimed is:

1. A check bits generating system for use in an error-correcting and error-detecting system, having means for performing both a b-bit single burst block error correcting operation and a double burst block error detecting operation in accordance with a (k, l) type check matrix comprising: a check-bits generating circuit, operated in accordance with said (k, l) type check matrix, for receiving input data which is to be checked for errors and for producing an output check-bits code wherein said (k, l) type check matrix is constructed from:

a first means for providing outputs corresponding to submatrices (1) and (2) to said check-bits generating circuit, said sub-matrix (1) consisting of an (m, l) type reference sub-matrix (where m < k), and said sub-matrix (1) is composed of a plurality of (m, n) type unit-matrices (where n < l), said sub-matrix (2) consisting of one or more (m, l) type sub-matrices, each of said one or more (m, l) type sub-matrices is also composed of said plurality of (m, n) type unit-matrices;

shifting means, operatively connected to said check-bits generating circuit, for shifting the locations of said plurality of (m, n) type unit-matrices in each of said sub-matrices (1) and (2) by a circular shift wherein said locations are different from each other; and second means, operatively connected to said check-bits generating circuit, for alternately stacking respective rows of said sub-matrix (1) and said sub-matrix (2) by means of reciprocal replacement to compose said (k, l) type check matrix, wherein said check-bits generating circuit is comprised of a plurality of identical circuit units having outputs, said input data is provided to said plurality of identical circuit units, said input data is shifted by said shifting means so that said plurality of identical circuit units function in accordance with said sub-matrix (1) and said sub-matrix (2), said outputs of said plurality of identical circuit units are rearranged by said second means to form said output check-bits code.

2. A system as set forth in claim 1, wherein said (m, l) type reference sub-matrix is an (8, 64) type reference sub-matrix, said (m, l) type sub-matrix is an (8, 64) type sub-matrix, and said (k, l) type check matrix is a (16, 64) type check matrix; wherein said (8, 64) type reference sub-matrix is composed of first and second (8, 32) type unit-matrices arranged side by side and said (8, 64) type sub-matrix is composed of said second and first (8, 32) type unit-matrices arranged side by side; wherein each of said (8, 32) type unit-matrices is composed of two rows of matrices; and wherein each of said two rows of matrices is composed of element-matrices selected from H-matrices $\boxed{O}$, H-matrices $\boxed{I}$ and H-matrices $\boxed{T^n}$ (n=0,1,2,3 . . . ), where $$O = \begin{bmatrix} 0 & 0 & 0 & 0 \\ 0 & 0 & 0 & 0 \\ 0 & 0 & 0 & 0 \\ 0 & 0 & 0 & 0 \end{bmatrix}$$

$$\boxed{I} = \begin{bmatrix} 1 & 0 & 0 & 0 \\ 0 & 1 & 0 & 0 \\ 0 & 0 & 1 & 0 \\ 0 & 0 & 0 & 1 \end{bmatrix}$$

$$\boxed{T} = \begin{bmatrix} 0 & 1 & 0 & 0 \\ 0 & 0 & 1 & 0 \\ 1 & 0 & 0 & 1 \\ 1 & 0 & 0 & 0 \end{bmatrix}$$

and the first, second, third and fourth rows of said (16, 64) type check matrix are respectively comprised of the first row of said (8, 64) type reference sub-matrix, the first row of said (8, 64) type sub-matrix the second row of said (8, 64) type reference sub-matrix and the second row of said (8, 64) type sub-matrix.

3. A system as set forth in claim 2, wherein said input data is multiplied by said (8, 64) type reference sub-matrix in a first of said plurality of identical circuit units and the first and third check-bits codes are produced from the first and second rows of said (8, 64) type reference sub-matric, respectively; and said input data is multiplied by said (8, 64) type sub-matrix in a second of said plurality of identical circuit units and the second and fourth check-bits codes are produced from said first and second rows of said (8, 64) type sub-matrix respectively, whereby rearranged check-bits codes of said first through fourth check bits codes form said output check-bits code.

4. A system as set forth in claim 1, wherein said (m, l) type reference sub-matrix is an (8, 128) type reference sub-matrix, said (m, l) type sub-matrices are first through third (8, 128) type sub-matrices and said (k, l) type check matrix is a (32, 128) type check matrix; wherein said (8, 128) type reference sub-matrix is composed of first through fourth (8, 32) type unit-matrices arranged side by side; wherein said first (8, 128) type sub-matrix is composed of said fourth, first, second and third (8, 32) type unit-matrices arranged in said reference sub-matrix side by side, said second (8, 128) type sub-matrix is composed of said third, fourth, first and second (8, 32) type unit-matrices in said reference sub-matrix arranged side by side, said third (8, 128) type sub-matrix is composed of said second, third, fourth and first (8, 32) type unit-matrices in said reference sub-matrix arranged side by side and wherein each of said (8, 32) type unit-matrices is composed of two rows of matrices and each of the two rows of the matrices is composed of element-matrices selected from H-matrices $\boxed{O}$, H-matrices $\boxed{I}$ and H-matrices $\boxed{T^n}$ (n=0,1,2,3 . . . ), where $$O = \begin{bmatrix} 0 & 0 & 0 & 0 \\ 0 & 0 & 0 & 0 \\ 0 & 0 & 0 & 0 \\ 0 & 0 & 0 & 0 \end{bmatrix}$$

$$\boxed{I} = \begin{bmatrix} 1 & 0 & 0 & 0 \\ 0 & 1 & 0 & 0 \\ 0 & 0 & 1 & 0 \\ 0 & 0 & 0 & 1 \end{bmatrix},$$

$$\boxed{T} = \begin{bmatrix} 0 & 1 & 0 & 0 \\ 0 & 0 & 1 & 0 \\ 1 & 0 & 0 & 1 \\ 1 & 0 & 0 & 0 \end{bmatrix}.$$

and the first through the fourth rows of said (32, 128) type check matrix are respectively comprised of the first rows of said (8, 128) type reference sub-matrix and said first through third (8, 128) type sub-matrices, and the fifth through the eigth rows of said (32, 128) type check matrix are respectively comprised of the second rows of said (8, 128) type reference sub-matrix and said first through third (8, 128) type sub-matrices.

5. A system as set forth in claim 4, wherein said input data is multiplied by said (8, 128) type reference submatrix in a first of said plurality of identical circuit units and the first and the fifth check bits codes are produced from the first and second rows of said (8, 128) type reference sub-matrix, respectively; said input data is multiplied by said first (8, 128) type sub-matrix in a second of said plurality of identical circuit units and the second and the sixth check bits codes are produced from the first and second rows of said first (8, 128) type sub-matrix, respectively; said input data is multiplied by said second (8, 128) type sub-matrix in a third of said plurality of identical circuit units and the third and seventh check bits codes are produced from said first and second rows of said second (8, 128) type submatrix, respectively said input data is multiplied by said third (8, 128) type sub-matrix in a fourth of said plurality of identical circuit units and the fourth and the eighth check bits codes are produced from said first and second rows of said third (8, 128) type sub-matrix, respectively; whereby rearranged check-bits codes of said first through eighth check bits codes form said output check-bits code.

6. An error-correcting and error-detecting system having means for performing both a b-bit single burst block error correcting operating and a double burst block error detecting operation comprising:
   check-bits generating means, including matrix means for generating elements of a digital word corresponding to a predetermined check matrix, for performing a matrix multiplication operation between the elements of a received input digital data word for which a check-bits code is to be generated and said elements of a digital word corresponding to a predetermined check matrix and for providing an output corresponding to the result of said matrix multiplication operation;

comparison means, operatively connected to said check bits generating means, for comparing said output result with a receive check-bits code word and for providing output information for correction of said received input digital data word;

correction means, operatively connected to said comparison means, for correcting said received input digital word in accordance with the output information of said comparison means and for providing a corrected data word, wherein said check matrix is (k, l) type matrix and is composed of rows of matrices, each of which is an (m, l) type reference sub-matrix (where m is less than k) and at least one (m, l) type shift sub-matrix, said (m, l) type reference sub-matrix and shift sub-matrix are composed of a plurality of (m, n) type unit-matrices (where n is less than l), the locations of said (m, n) type unit matrices in said reference sub-matrix and said at least one shift sub-matrix are obtainble by shifting said reference sub-matrix by a circular shift.

7. A system according to claim 6, wherein said check bits generating means comprises:

a first circuit unit means, operatively connected to receive the elements of said received input digital data word, including means for multiplying said received input digital data word by said (m, l) type reference sub-matrix and means for providing a first and third check bits code output;

a second circuit unit means, operatively connected to receive the elements of said received input digital data word, including means for multiplying the elements of said received input digital data word by said (m, l) type shift sub-matrix and means for providing a second and fourth check bits code output, whereby said output corresponding to the result of said matrix multiplication operation is provided by rearranging said first, second, third and fourth check bits code outputs.

8. A system according to claim 7 further comprising:

first and second data buses, operatively connected between said first circuit unit means and said comparison means, for rearranging said first and third check bits code outputs respectively;

third and fourth data buses, operatively connected between said second circuit unit means and said comparison means, for rearranging said second and fourth check bits code outputs, respectively.

9. A system according to claim 6, wherein said check bits generating means comprises:

a first circuit unit means, operatively connected to receive the elements of said received input digital data word, including means for multiplying said received input digital data word by said (m, l) type reference sub-matrix and means for providing a first and fifth check bits code output;

a second circuit unit means, operatively connected to receive the elements of said received input digital data word, including means for multiplying said received input digital data word by said (m, l) type shift sub-matrix and means for providing a second and sixth check bits code output;

a third circuit unit means, operatively connected to receive the elements of said received input digital data word, including means for multiplying said received input digital data word by said (m, l) type reference sub-matrix and means for providing a third and seventh check bits code output;

a fourth circuit unit means, operatively connected to receive the elements of said received input digital data word, including means for multiplying said received input digital data word by said (m, l) type reference sub-matrix and means for providing a fourth and eighth check bits code output; and output means, operatively connected to said first, second, third and fourth circuit unit means, for providing said output corresponding to the result of said matrix multiplication operation, including rearranging means for rearranging said first through eighth check bits code outputs.

10. A system according to claim 9 wherein said rearranging means comprises:

first and second data buses, operatively connected between said first circuit unit means and said comparison means, for rearranging said first and fifth check bits code outputs, respectively;

third and fourth data buses, operatively connected between said second circuit unit means and said comparison means for rearranging said second and sixth check bits code outputs, respectively;

fifth and sixth data buses, operatively connected between said third circuit unit means and said comparison means for rearranging said third and seventh check bits code outputs, respectively;

seventh and eighth data buses, operatively connected between said fourth circuit unit means and said comparison means, for rearranging said fourth and eighth check bits code outputs, respectively.

* * * * *